United States Patent
Dutta

(10) Patent No.: US 10,879,156 B2
(45) Date of Patent: Dec. 29, 2020

(54) MITIGATION OF WHISKER GROWTH IN TIN COATINGS BY ALLOYING WITH INDIUM

(71) Applicant: Washington State University, Pullman, WA (US)

(72) Inventor: Indranath Dutta, Pullman, WA (US)

(73) Assignee: Washington State University, Pullman, WA (US)

(*) Notice: Subject to any disclaimer, the term of this patent is extended or adjusted under 35 U.S.C. 154(b) by 0 days.

(21) Appl. No.: 15/169,194

(22) Filed: May 31, 2016

(65) Prior Publication Data
US 2017/0263541 A1    Sep. 14, 2017

Related U.S. Application Data

(60) Provisional application No. 62/305,019, filed on Mar. 8, 2016.

(51) Int. Cl.
| | | |
|---|---|---|
| H01L 23/495 | (2006.01) | |
| C25D 3/30 | (2006.01) | |
| C25D 7/00 | (2006.01) | |
| C25D 5/50 | (2006.01) | |
| C22C 13/00 | (2006.01) | |
| C22F 1/16 | (2006.01) | |

(52) U.S. Cl.
CPC ........ H01L 23/49582 (2013.01); C22C 13/00 (2013.01); C22F 1/16 (2013.01); C25D 3/30 (2013.01); C25D 5/505 (2013.01); C25D 7/00 (2013.01)

(58) Field of Classification Search
CPC ..... H01L 23/49582; C22C 13/00; C22F 1/16; C25D 3/30; C25D 5/505; C25D 7/00

USPC .......................................................... 174/255
See application file for complete search history.

(56) References Cited

U.S. PATENT DOCUMENTS

| | | | |
|---|---|---|---|
| 4,586,012 A * | 4/1986 | Koizumi | H01F 6/06 |
| | | | 174/125.1 |
| 4,935,312 A | 6/1990 | Nakayama et al. | |
| 4,959,278 A | 9/1990 | Shimauchi et al. | |
| 5,750,017 A | 5/1998 | Zhang | |
| 6,331,240 B1 | 12/2001 | Tsunoda et al. | |
| 6,720,499 B2 | 4/2004 | Bokisa et al. | |
| 7,795,799 B2 * | 9/2010 | Mishima | C09K 11/06 |
| | | | 257/E51.044 |
| 2006/0113006 A1 | 6/2006 | Masuda et al. | |

(Continued)

FOREIGN PATENT DOCUMENTS

RU    0002458188    8/2012

OTHER PUBLICATIONS

Meinshausen et al., "Effect of Solute Addition and Grain Structure Modification on Boundary Diffusion and Whisker Growth in Tin Coatings," Presentation delivered at symposium on *Pb-Free Soldiers and Emerging Interconnect and Packaging* on Mar. 15, 2015 (abstract only).

(Continued)

*Primary Examiner* — Tremesha S Willis
(74) *Attorney, Agent, or Firm* — Klarquist Sparkman, LLP

(57) ABSTRACT

A method comprising incorporating indium into an entire Sn film for preventing the growth of whiskers from the Sn film, wherein the Sn film is applied to a metallic substrate. The indium is present in the entire thickness of the Sn film.

21 Claims, 7 Drawing Sheets

(56) References Cited

U.S. PATENT DOCUMENTS

| | | | | |
|---|---|---|---|---|
| 2008/0073662 A1* | 3/2008 | Wang | ............ | H01L 33/58 257/99 |
| 2010/0084050 A1* | 4/2010 | Kraemer | ............ | B23K 35/262 148/23 |
| 2010/0116674 A1 | 5/2010 | Luo et al. | | |
| 2012/0049229 A1* | 3/2012 | Lim | ............ | H01L 33/382 257/98 |
| 2014/0035131 A1* | 2/2014 | Noh | ............ | H01L 23/49811 257/737 |
| 2015/0122661 A1 | 5/2015 | Woertnik et al. | | |
| 2016/0141080 A1* | 5/2016 | Otto | ............ | H01L 39/248 505/230 |
| 2017/0110392 A1* | 4/2017 | Lin | ............ | H01L 21/4853 |

OTHER PUBLICATIONS

Meinshausen et al., "Influence of Indium Addition on Whisker Mitigation in Electroplated Tin Coatings on Copper Substrates," *Journal of Electronic Materials*, 45(1): 791-801, Jan. 2016.

Meinshausen et al., "Mitigation of Tin Whisker Growth by Dopant Addition," Presentation delivered at ASME 2015 International Technical Conference and Exhibition on Packaging and Integration of Electronic and Photonic Microsystems collocated with the ASME 2016 13$^{th}$ International Conference on Nanochannels, Microchannels, and Minichannels, Jul. 6-9, 2015 (abstract only).

Gernon et al., "Environmental benefits of methanesulfonic acid. Comparative properties and advantages," *Green Chem.*, 1(3): 127-140, 1999. (Abstract only).

Ota et al., "Plating of Indium-Tin Alloy," *Metal Surface Finishing*, 16(6): 246-250, 1965. (English translation).

Pewnim et al., "Electrodeposition of tin-rich Cu—Sn alloys from a methanesulfonic acid electrolyte," *Electrochimica Acta*, vol. 90, pp. 498-506, 2013.

Suzuki, "The Plating of Indium-Tin Alloy," *Metal Surface Finishing*, 15(8): 283-288 1964. (English translation).

Non-Final Office Action issued for U.S. Appl. No. 15/654,291 dated Jul. 3, 2019.

Final Office Action issued for U.S. Appl. No. 15/654,291 dated Jan. 13, 2020.

* cited by examiner

Schematics showing the lay-ups of Sn-In and Sn/In/Sn coatings on Cu substrate before HT (1A and 1C), and after HT (1B and 1D). Indium diffuses through the entire Sn thickness during HT.

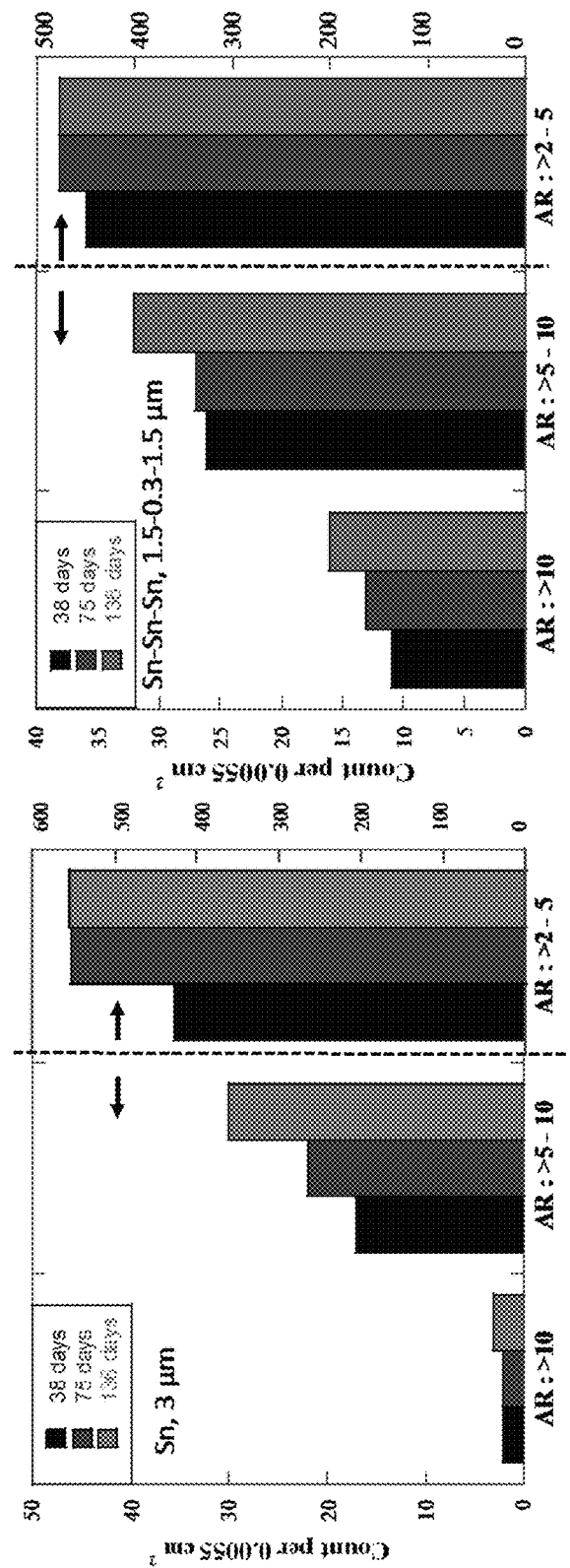
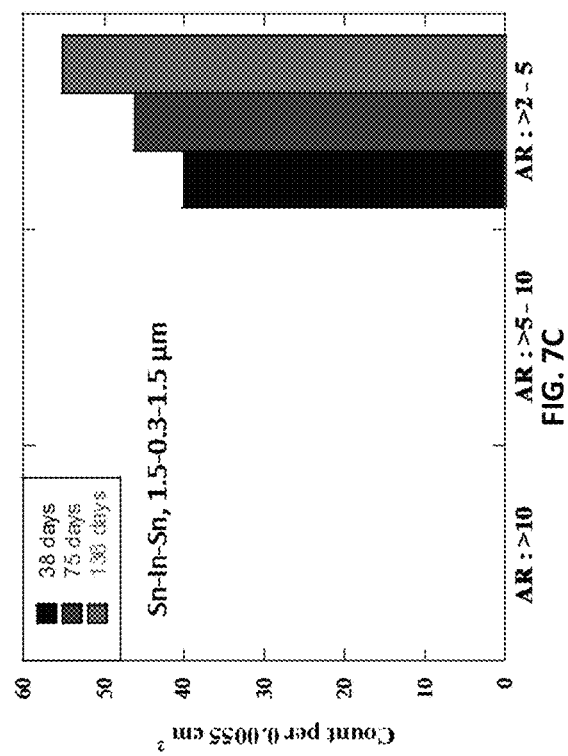
FIG. 7A
FIG. 7B
FIG. 7C

MITIGATION OF WHISKER GROWTH IN TIN COATINGS BY ALLOYING WITH INDIUM

This application claims the benefit of U.S. Provisional Appl. No. 62/305,019, filed Mar. 8, 2016, which is incorporated herein by reference in its entirety.

ACKNOWLEDGMENT OF GOVERNMENT SUPPORT

This invention was made with government support under 1335491 awarded by the NSF. The government has certain rights in the invention.

BACKGROUND

In electronic packages, copper lead-frames and other electrical circuit parts are often coated with 1-20 µm thick Sn to facilitate subsequent soldering for lead attachment, and to reduce oxidation and corrosion of the lead-frame or other part. Frequently, Sn whiskers, which may be hundreds of micrometers long, extrude from the coated surface during long-term isothermal holds, potentially causing electrical shorts between neighboring circuitry. Although commonly noted in electroplated coatings, whiskers grow from all types of tin coatings, including vacuum-deposited films. Failures have been reported in high power devices in civil, military and space avionics, as well as in consumer electronics, and the failure can be traced to short-circuiting caused by the growth of long whiskers or whisker debris in dense electrical systems. This invention reports on an approach to stop the growth of whiskers with long aspect ratios from tin platings, without the use of lead.

Because of its widespread impact on electronics in a wide range of applications, numerous studies have investigated methodologies for reducing whisker growth from tin-coatings since the 1960s. Adding 3-5% Pb to the Sn-coating has been the most effective and widely-practiced approach to mitigate the formation of Sn whisker in the entire electronics industry, including consumer, defense and aerospace. However, European and Japanese regulations in the mid-2000s mandated complete elimination of Pb from all electronics, forcing the industry to comply with the Pb-free standards for all nations for the sake of uniformity of products. This has brought the Sn-whisker growth problem to the forefront again since the late-2000s, spurring the development of alternative technologies to slow whisker growth.

To date, two main Pb-free approaches have been found to be moderately successful in slowing whisker growth in the industry. The first is to use a polymeric conformal coating on top of the electroplated Sn to slow the emergence of whiskers from underneath the coating. The second is to use Ni as a diffusion barrier between the Sn plating and Cu lead-frame to slow intermetallic compound formation at the interface, which generates the stress in Sn that drives whisker growth. Both approaches slow, but do not stop whisker growth, and for long-term applications (>10 years), where whisker growth is a particular problem, these solutions are of limited efficacy. Other approaches that have been suggested are annealing the Sn and alloying the Sn with bismuth to reduce stress. But neither is an industrially acceptable approach, since the first provides only a very short-term advantage, and the second, despite reducing the compressive stress in Sn, has not been shown to actually reduce the growth of whiskers, let alone stop it.

In contrast, incorporation of indium in tin coatings deposited by electroplating, that is a subject of this invention, has been shown to completely mitigate whisker growth, with no evidence of whiskers of aspect ratio greater than 5 even after 4 months or event after 6 months. As such, in terms of Sn whisker mitigation, indium is a direct substitute for Pb, which is known to slow, but not stop whisker growth, particularly when less than 4% is used to alloy Sn. Indium, in the range of 1-20 weight percent, more particularly 1-15 weight percent, can be introduced into the Sn coating by numerous different techniques, and is expected to stop whisker growth irrespective of the specific technique used, provided that the entire Sn layer is alloyed with In.

SUMMARY

Disclosed herein are methods for incorporating indium into an entire Sn film for preventing the growth of whiskers from the Sn film, wherein the Sn film is applied to a metallic substrate. The indium is present in the entire thickness of the Sn film.

Also disclosed herein is a lead-frame comprising a metallic substrate and an indium-containing Sn layer in direct contact with metallic substrate, wherein the indium is present throughout the entire thickness of the Sn layer.

The foregoing and other objects, features, and advantages will become more apparent from the following detailed description, which proceeds with reference to the accompanying figures.

BRIEF DESCRIPTION OF THE DRAWINGS

(FIG. 1A) Schematic of a cross-section comprising two electroplated layers of Sn and In deposited on a copper substrate, before incorporation of the In into Sn by diffusion; (FIG. 1B) Schematic of the cross-section of the lay-up in FIG. 1A after incorporation of In into the Sn-coating via heat treatment. (FIG. 1C) Schematic of a cross-section comprising three electroplated layers of Sn, In and Sn deposited on a copper substrate before incorporation of the In into Sn by diffusion; (FIG. 1D) Schematic of the cross-section of the lay-up in FIG. 1C after incorporation of In into the Sn-coating via heat treatment. (The Cu substrate lies below the bottom Sn layer in each figure.)

(FIG. 2A) Schematic of the cross-section of the BASELINE SAMPLE comprising a single layer of electroplated Sn on a copper substrate; (FIG. 2B) Schematic of the cross-section of the CONTROL SAMPLE comprising three layers of electroplated Sn. Both samples are subjected to the same heat-treatment as the TEST SAMPLE. The Sn/Sn/Sn samples were used to evaluate the influence of interfaces from the effects of In in the Sn/In/Sn samples.

FIGS. 7A-7C: Plot showing the number of growths of various aspect ratios (2<AR≤5, 5<AR≤10, and AR>10) in the Sn (FIG. 7A), Sn/Sn/Sn (FIG. 7B) and Sn/In/Sn (FIG. 7C) samples after aging for various times (38, 75 and 136 days) at ambient temperature. Growths of AR>5 are defined as whiskers, whereas growths of AR≤5 are hillocks or protrusions.

DETAILED DESCRIPTION

Disclosed herein are methods that incorporates indium in electroplated Sn films for preventing the growth of whiskers from Sn films that are applied to metallic substrates, particularly copper lead-frames. Whisker mitigation may be achieved by adding anywhere from 1 to 20 weight %, particularly 3 to 20 weight %, indium to the electroplated Sn layer, based on the total weight of In/Sn electroplated layer. Incorporating In into Sn to prevent whisker growth will prevent whisker growth from any Sn-rich alloy (i.e., >90 weight % Sn) that is susceptible to whisker growth, including Sn—Cu, Sn—Ag and alloys using Sn, Cu and Ag.

In certain embodiments, the indium-containing Sn is applied in direct contact with a substrate of copper or another metal that is used in electronic packages (e.g., nickel, tungsten, molybdenum, tantalum, palladium, gold, etc.). In other words, the indium-containing Sn is in direct physical contact with the metal substrate without any intervening layer or film disposed between the indium-containing Sn film and the copper lead-frame. The indium-containing Sn coating promotes subsequent soldering onto the metallic substrate.

In certain embodiments, the indium may be incorporated by depositing a small amount of indium at the bottom of, near the middle of, or near the top of the Sn film, and subsequently heat-treating the layered structure to incorporate the In into the entire Sn film by diffusion.

In addition to electroplating followed by heat treatment, any number of other methods can be used to incorporate the In into the Sn coating, including any method for co-deposition of In and Sn. For example, co-electrodeposition of Sn and In, vacuum co-deposition of Sn and In by sputtering, evaporation, etc., or layered vacuum deposition of Sn and In followed by a heat treatment, or chemical co-deposition of Sn and In (e.g., by a wet-chemical process) may be used.

In certain embodiments, a diffusional approach is utilized for incorporating the In into the Sn plating, while holding the overall In concentration between 5 wt. % and 10 wt. %. In the case of relatively low In concentrations (<7%), In should dissolve in the Sn matrix and thereby retain a single-phase structure. This would ensure that the base Sn properties are not influenced to any significant extent. The diffusional method of In incorporation may likely enhance/reduce In concentration at grain boundaries, since grain boundary diffusional kinetics are much faster than in the bulk. This may actually be advantageous, since much of the diffusion involved with whisker formation and growth likely occurs through the grain boundaries.

Figure 1A:
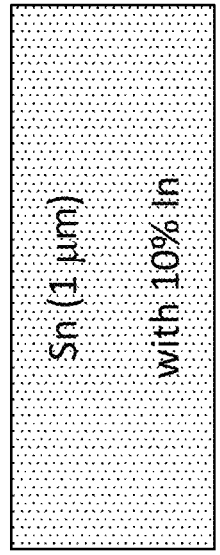
FIGS. 1A, 1B, 1C and 1D: Schematics of the cross-sections of the TEST SAMPLE before and after incorporation of In into Sn by diffusion.
Figure 1B:
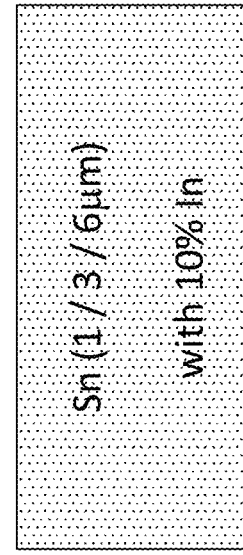
Figure 1C:
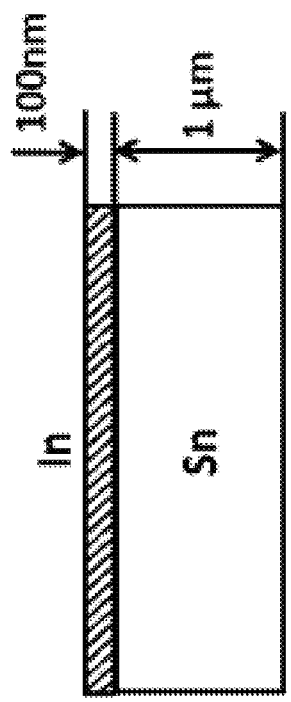

The electroplated In layer was incorporated into the Sn plating, either through a top coat at the Sn surface (In/Sn) or as a middle layer between two Sn platings in a sandwich-type geometry (Sn/In/Sn), see FIGS. 1A and 1C. The total In content was held to less than 10 wt %. The In/Sn samples were heat-treated at 125° C. or 160° C., whereas the Sn/In/Sn samples were heat-treated at 150° C. or 160° C. These temperatures enabled diffusion of In throughout the Sn, resulting in the structures shown in FIGS. 1B and 1D. Whisker growth data for these platings are reported for up to a 6-month period and are compared with appropriate control samples.

An electroplated Sn layer is first deposited on a metallic (e.g., copper) substrate. For samples where the In layer is to be applied as a top-coat (In/Sn), the layer thickness is about the total desired film thickness. In the experiments conducted, this layer was 1 μm thick. For samples where the In layer is to be applied as a middle layer between two Sn coatings (Sn/In/Sn), the layer thickness is about half the thickness of the desired thickness of the final electroplated coating. In the experiments conducted, this layer was either 0.5 μm, 1.5 μm or 3 μm thick. However, in certain embodiments the thickness layer of the initial Sn layer may be 0.1 to 20 μm, more particularly 0.25 to 10 μm.

The plated substrate is extracted from the Sn-plating bath, washed, and reinserted into a second plating bath for electroplating of indium. An In coating of 5-10% of the total desired thickness of the final film is electroplated on the existing Sn layer. For the experiments conducted, this layer was either 0.1 μm, 0.3 μm or 0.6 μm thick. However, in certain embodiments the thickness layer of the In layer may be 0.1 to 20 μm, more particularly 0.25 to 10 μm.

For the sample with indium as a top-coat (In/Sn), the plated substrate is extracted from the In-plating bath, washed, dried and subsequently heat treated at 125° C. for 30 minutes, or at 160° C. for 10 minutes, allowing indium to diffuse into the Sn layer below the In layer. These heat-treatments allow the indium to diffuse through the entire thickness of the Sn layer, although the concentration of indium decreases with increasing distance from the surface.

For the sandwich sample with indium between two Sn layers (Sn/In/Sn), the plated substrate was extracted from the In-plating bath, washed, and reinserted into the Sn-plating bath, and coated with another layer of electroplated Sn. In these experiments, the thickness of this Sn layer was 0.5 μm, 1.5 μm or 3 μm. However, in certain embodiments the thickness layer of the second Sn layer may be 0.1 to 20 μm, more particularly 0.25 to 10 μm.

The final thickness of the indium-containing Sn layer may be 0.1 to 20 μm, more particularly 0.25 to 10 μm.

The Sn/In/Sn sample with total Sn thickness of 1 μm is then heat-treated at either 150° C. for 90 minutes, or 160° C. for 45 minutes, the sample with total Sn thickness of 3 μm is heat treated at 160° C. for 4 hours, and the sample with total Sn thickness of 6 µm is heat treated at 160° C. for 8 hours, to allow the indium to diffuse into the tin layers on both sides of the In layer. This incorporates the In fully into the tin layer, the entirety of which becomes alloyed with In, with at least 5-7 atomic percent at all locations of the tin layer. In certain embodiments the heat treatment may range from 75 to 180° C., for 5 minutes to several hours, depending on the thickness of the Sn layer(s) adjoining the In layer.

The effect of doping electroplated tin coatings on copper substrates with 5-10 wt. % indium on the growth of tin whiskers was studied. The In was incorporated into the Sn coating by diffusion from a 0.5-1 m-thick layer deposited either on top of the Sn coating (In/Sn) or between two layers of Sn coating (Sn/In/Sn). Following electroplating, diffusion of In into the Sn layer(s) was accomplished by heat treatment (HT) in vacuum at temperatures between 125° C. and 160° C. Whisker growth kinetics were studied on these samples at room temperature, and compared with those on a pure-Sn plating (baseline) and Sn—Sn—Sn plating (control), subjected to the same HT(s) as the test samples. The In/Sn sample showed substantially reduced whisker growth during room temperature aging compared to the baseline-Sn sample subjected to an identical heat treatment. However, whisker growth in the In/Sn samples following HT at 125° C. or 160° C., although substantially reduced, was not eliminated. A small but finite number-density of whiskers appeared after about 200 hours of aging at RT, and continued to increase. A complete elimination of whisker growth was accomplished in the Sn/In/Sn samples following HT at both 150° C. and 160° C., when the HT time was sufficient to produce a minimum atomic concentration of about 5% In throughout the Sn coating. No whiskers were found on the Sn/In/Sn sample surfaces after 6 months of aging at RT. In the Sn/In/Sn samples, the principal rationale for placing the In layer in the middle of the Sn coating was to enable nearly uniform incorporation of In throughout the thickness of the Sn coating. Possible reasons for the observed mitigation of whisker growth are: (i) reduction in Sn grain boundary diffusivity due to In segregation at the Sn grain boundaries, (ii) reduction in the tenacity of the native oxide layer on the surface of the tin-coating by In incorporation, and (iii) reduction in compressive stress in the Sn coating due to the formation of Cu—In intermetallic compounds in addition to the normally present Cu—Sn intermetallic compounds at the interface between the Sn coating and the Cu substrate.

Whisker growth on the In/Sn sample is studied over several months during aging at room temperature, and compared with whisker growth on an identically thick single-layer pure Sn electroplated sample on an identical Cu substrate, heat-treated in an identical manner as the test sample.

Whisker growth on the Sn/In/Sn sample is studied over several months during aging at room temperature, and compared with whisker growth on two different samples: (1) an identically thick control sample with three layers of Sn on a copper substrate, where the middle layer of indium is substituted by Sn, and subjected to the same heat treatment as that of the test sample; and (2) an identically thick single-layer pure Sn electroplated sample on an identical Cu substrate, heat-treated in an identical manner as the test sample.

Figure 3:
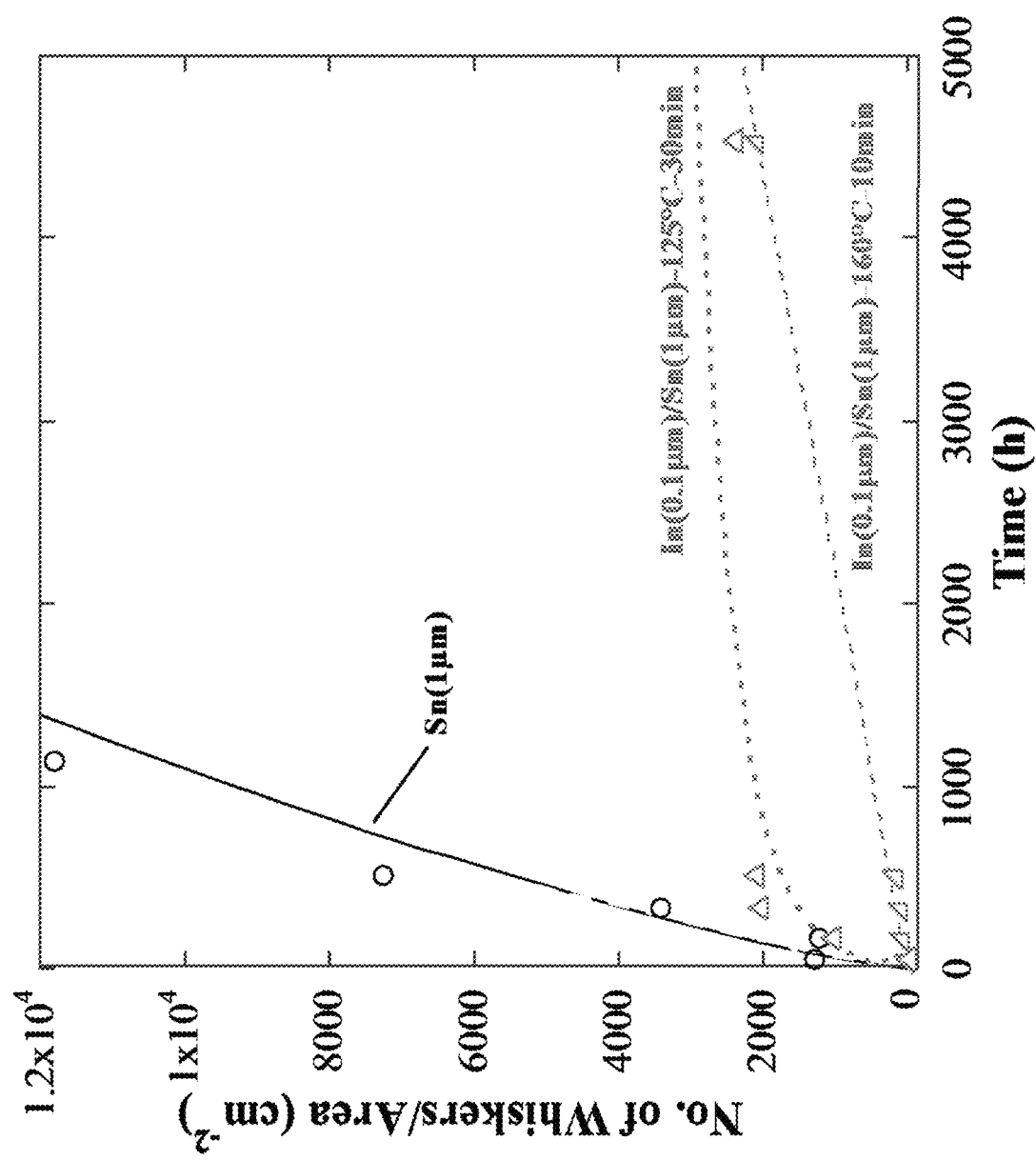
FIG. 3: Plot showing the density of whiskers (i.e., number of whiskers per unit area) of aspect ratio (AR) larger than 5 with aging time at room temperature, for the In/Sn coating shown in FIG. 1B, and for a baseline monolithic Sn coating shown in FIG. 2A. The In/Sn coatings were heat treated for either 125° C. for 30 minutes or 160° C. for 10 minutes. The monolithic Sn sample shows a very large whisker density after 4000 hours, but the In/Sn samples show significantly less, albeit not zero, whisker growth at the same time.

It is observed that for the 1 µm thick In/Sn sample, very few whiskers of aspect ratio (i.e., length-to-diameter ratio) greater than 5 grows, even after 6 months, when 5-10% Indium is added to the Sn as a top-coat and then diffused in. A small but finite number-density of whiskers appeared after about 200 hours of aging at RT, and continued to increase with increasing aging time for the samples heat-treated at both 125° C. and 160° C. In contrast, the baseline monolithic Sn film grows a large number of long whiskers in the same time. A plot of the number-density (i.e., number of whiskers per unit area of the sample) of whiskers in the In/Sn and the baseline Sn samples is shown in FIG. 3. Approximately two and three orders of magnitude of reduction in whisker density is noted in the In/Sn samples treated at 125° C. and 160° C., respectively, compared to the Sn sample.

It is observed for the 1 µm, 3 µm and 6 µm thick Sn/In/Sn samples that no whiskers of aspect ratio (i.e., length-to-diameter ratio) greater than 5 grows, even after 6 months when 5-10% Indium is added to the Sn. In contrast, both the baseline monolithic Sn films, as well as the control Sn/Sn/Sn films grow a large number of long whiskers in the same time. Scanning electron micrographs of the surfaces of the Sn, Sn/Sn/Sn and Sn/In/Sn coatings after aging at ambient temperature for 4.5 months are shown in FIGS. 3A and 3B. The number-density vs. aging time data for 1 µm and 3 µm thick Sn films, with and without indium, are shown in FIGS. 4A and 4B.

EXAMPLES

Details of sample fabrication and test results are described in the following. It is noted that although the experiments reported here were conducted on electroplated tin films (i.e., coating), the method disclosed is also applicable to films deposited by other techniques (e.g., vacuum deposition).

Sample Preparation

Sn was electroplated on oxygen-free high-conductivity (OFHC) Cu plates using an alkaline bath, principally because coatings from alkaline electrolytes tend to generate whiskers within 48 h, thereby permitting a degree of acceleration in whisker studies. However, the method disclosed herein may also be used with an acid bath or an alternate alkaline bath. The electrolyte comprised 142 g sodium tin (IV) oxide (Na2SnO3) and 14.96 g sodium hydroxide (NaOH) in 1 L of deionized water. Prior to electroplating, the electrolyte was filtered, and 0.5 g/L hydrogen peroxide was added to oxidize the sodium stannite (Na2SnO2), which may form during the storage of the electrolyte.

The OFHC Cu substrates (99.99%), which were 1 mm thick, were cut into 2.5 cm×2.5 cm plates, metallographically polished to a 0.05 µm finish, using a slightly basic (pH~11) colloidal silica as the final polishing step. Subsequently, the Cu was cleaned in warm (T<55° C.) sodium hydroxide to remove organic residuals. Just prior to electroplating, concentrated sulfuric acid (51%) was used to remove the Cu oxide layer at room temperature (RT).

The electrolyte was heated to 95° C., and electroplating was conducted using a current density of 50 mA/cm$^2$, using a stainless steel anode. The Sn plating rate was determined to be 1 µm in 45 s. Following electroplating, the samples were immediately cleaned with deionized water and dried in air.

For the indium plating, a commercial indium sulfamate plating bath from Indium Corporation was used with an indium anode. The chosen current density was 10 mA/cm$^2$ and the resulting plating rate was approximately 5 nm/s. The plating was conducted at room temperature. The electrolytes for both Sn and In platings were stirred at approximately 600 RPM.

For the In/Sn samples where In was applied only as a top layer, a sequential plating of 1 µm-thick pure Sn was utilized, followed by an over-plate of approximately 0.1

μm-thick In plating (see FIGS. 1A and 1B). For the Sn/In/Sn samples, approximately 0.5 μm Sn plating was utilized as the first layer, followed by a plating of either 0.05 μm or 0.1 μm of In, and finally a plating of another 0.5 μm Sn (see FIGS. 1C and 1D). The sequential approach was used because a suitable bath that permits simultaneous electroplating of Sn and In in the requisite proportions has not been established. In the case of multilayered samples, the influence of interfaces as possible sinks for vacancies must be taken into account. Hence, another set of samples with three Sn layers (0.5 μm/0.05 μm or 0.1 μm/0.5 μm) were fabricated, in which electroplating was interrupted twice, the samples were rinsed, and then transferred back into the electrolyte for the subsequent Sn plating step (see FIGS. 2A and 2B). This produced a control sample against which the effect of In incorporation into the Sn layer could be assessed.

Figure 1D:
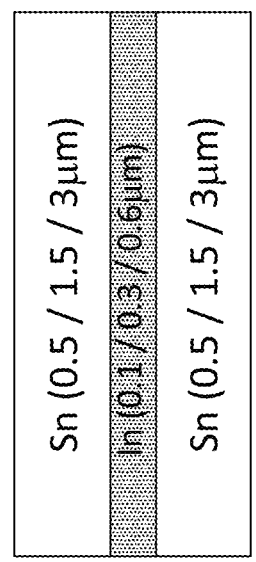
Figure 2B:
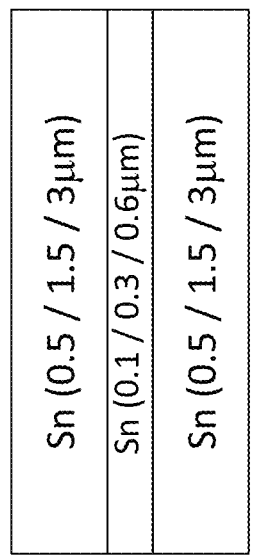
FIGS. 2A and 2B.
Figure 2A:
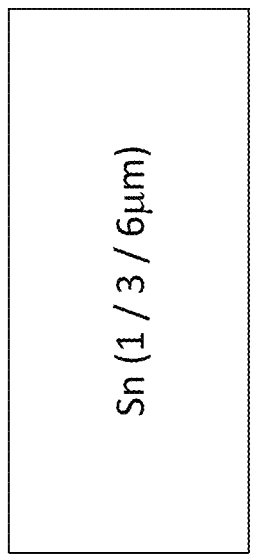

Following plating, the samples were heat-treated under different conditions (at 125° C. for 30 min or 160° C. for 10 min for the nominally 1 μm thick In/Sn samples, at 150° C. for 90 min or 160° C. for 45 min for the 1 μm thick Sn/In/Sn sample, and at 160° C. for 4 hours and 8 hours, respectively, for Sn/In/Sn samples of 3 μm and 6 μm thickness). The HT caused In to diffuse through the Sn layer(s) and result in doping of the Sn. For the In/Sn samples, the HT caused diffusion of In through most of the Sn layer, but the concentration of indium decreased with increasing distance from the surface. For the Sn/In/Sn samples, the HT caused diffusion of In through the entire Sn layer, the entirety of which became alloyed with In, with at least 5-7 atomic percent at all locations of the tin layer. The HTs were performed in a vacuum furnace ($1\times10^{-3}$ Pa) to avoid oxidation. The HT temperatures were chosen to be somewhat below and just above the melting point of In (157° C.), and well below the melting temperature of Sn. Since all HT temperatures constituted high homologous temperatures for Sn (0.84-0.87$T_m$), where volume diffusion should dominate, bulk diffusion data were utilized to estimate the diffusion distances. During HT, In diffused all of the way through the entire Sn coating for the Sn/In/Sn samples, and nearly all the way for the In/Sn sample, as schematically illustrated in FIGS. 1B and 1D.

To evaluate the possible influence of HT on whisker growth, the control samples made of pure Sn (layered or monolithic, as appropriate) were subjected to HTs identical to those of the In-doped samples. Whisker growth studies were conducted on the monolithic Sn baseline samples following HT, and compared with results on the In/Sn samples. Whisker growth studies were conducted on the Sn—Sn—Sn control samples following HT, and compared with results on the Sn/In/Sn samples.

After the HT, the samples were aged at room temperature (RT) for up to 6 months, and whisker growth was documented by scanning electron microscopy (SEM) as aging progressed.

Microscopy and Analysis

The following procedure was used to document whisker growth. For each sample, 24 scanning electron micrographs were acquired, covering a cumulative surface area of 5.23 mm². The SEM pictures were analyzed using ImageJ software. Growths or particles with an aspect ratio (AR) larger than 5 were defined as whiskers. Growths or particles with AR of 5 and less were defined as protrusions or hillocks. Then, the number density of whiskers in each sample was determined and plotted.

The chemical composition of the 3 μm thick Sn/In/Sn coating was characterized via Auger electron spectroscopy in the through-thickness direction by sputtering and depth-profiling to ascertain the extent of diffusion of In in the Sn layers during HT.

Results

Whisker Growth on In/Sn Samples

The In/Sn sample had a 1 μm thick Sn layer followed by a 0.1 μm In plating on top. Following HT at 125° C. for 30 minutes, some residual In was left on the surface of the coating, and the grain structure of Sn was not clearly visible in the scanning electron microscope. Following HT at 160° C. for 10 minutes, no visible difference was noted between the surface grain structures of the In/Sn sample and the baseline Sn sample. This indicated that the HT at 160° C. has enabled all of the 0.1 μm-thick In over-plating to diffuse into the Sn layer.

The Sn/In/Sn samples had a 0.1 μm-thick layer of In sandwiched between two 0.5 μm thick Sn layers, or a 0.3 μm-thick layer of In sandwiched between two 1.5 μm thick Sn layers. Following HT at 150° C. (90 minutes for the 1 μm thick sample) or 160° C. (45 minutes for the 1 μm thick sample and 4 hours for the 3 μm thick sample), all of the In layer diffused into Sn.

As evident from FIG. 3, the In/Sn samples show substantially reduced whisker growth than the pure Sn samples. Of particular interest is that the whisker density in the In/Sn sample heat treated at 160° C. for 10 minutes is three orders of magnitude less compared to the pure Sn sample over a period of 6 months (i.e., 180 days).

Thus, the whisker growth data for the In/Sn sample indicate that incorporation of In into the Sn layer via diffusion at 160° C. has a strong positive effect on whisker growth mitigation, although it does not stop whisker growth.

Whisker Growth on Sn/In/Sn Samples

Additional evidence that incorporating In into Sn may serve to reduce whisker growth is obtained from Sn/In/Sn samples. Based on measured plating rates for Sn and In, the plating times were selected so as to produce a sandwich Sn/In/Sn plating consisting of approximately 0.5 μm-thick or 1.5 μm-thick Sn, followed by 0.1 μm-thick or 0.3 μm-thick In, and then a final Sn plating of approximately 0.5 μm or 1.5 μm thickness. The overall In content in the Sn ranged between 5 wt % and 10 wt %. The intermediate In plating was utilized to (a) minimize any direct effect of In coating on the surface, as may have occurred for the In/Sn samples, and (b) minimize the diffusion distance necessary to obtain a more uniform In distribution throughout the Sn plating. The HT time at 160° C. was increased from 10 min to 45 min in order to ensure full incorporation of In in Sn, as well as to produce a relatively uniform through-thickness In concentration in Sn. In addition, a second HT for 90 minutes at 150° C. was also conducted with the same objectives.

The presence of In between two Sn layers created two additional interfaces which could act as vacancy sinks and sources and influence whisker growth, independently of the presence of In. Even if the In layer disappears due to diffusion into the Sn layers above and below it, incipient oxide layers formed during transfer of the sample between different electrolytes may cause these interfaces to persist and to act as vacancy sinks/sources. Hence, control samples with three layers of Sn (0.5 μm/0.5-0.1 μm/0.5 μm or 1.5 μm/0.3 μm/1.5 μm) were fabricated by interrupting the Sn plating process, enabling contact of the sample with air between plating steps. These tri-layered Sn samples, also called the Sn/Sn/Sn control samples, also received the 150°

C. HT (90 min for the nominally 1 μm thick sample) or the 160° C. HT (45-min for the nominally 1 μm thick, and 4 hours for the nominally 3 μm thick coatings).

Figure 4C:
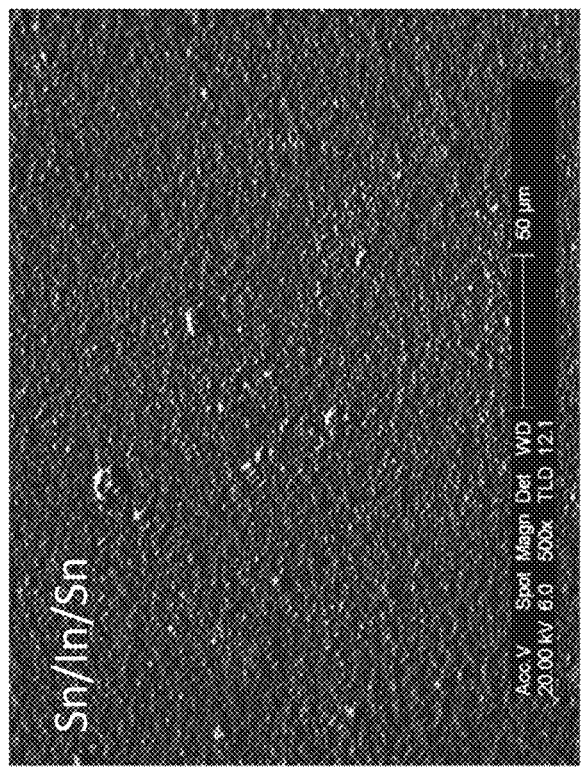
FIGS. 4A, 4B and 4C: Scanning electron micrographs of the surfaces of 3 µm thick layers of (A) the BASELINE sample of Sn, (B) the CONTROL sample of Sn/Sn/Sn, and (C) the TEST sample of Sn/In/In, after aging for 4.5 months at ambient temperature. Whiskers are seen in the BASELINE and CONTROL samples, but not in the TEST sample.
Figure 4A:
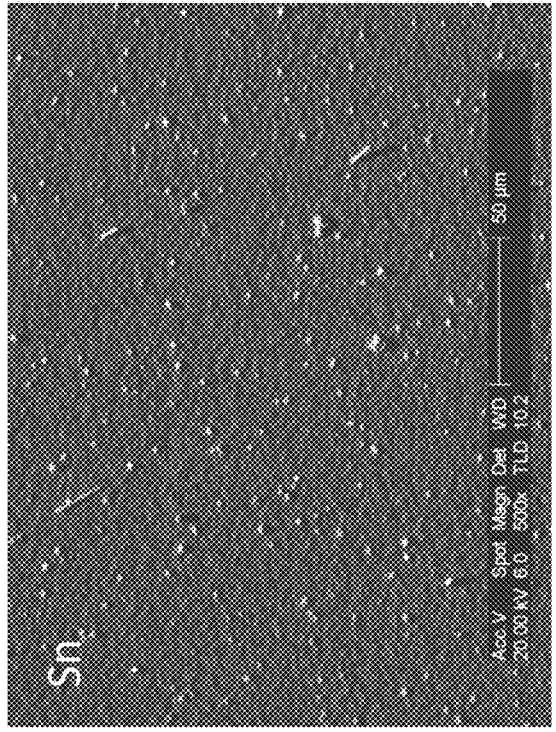
Figure 4B:
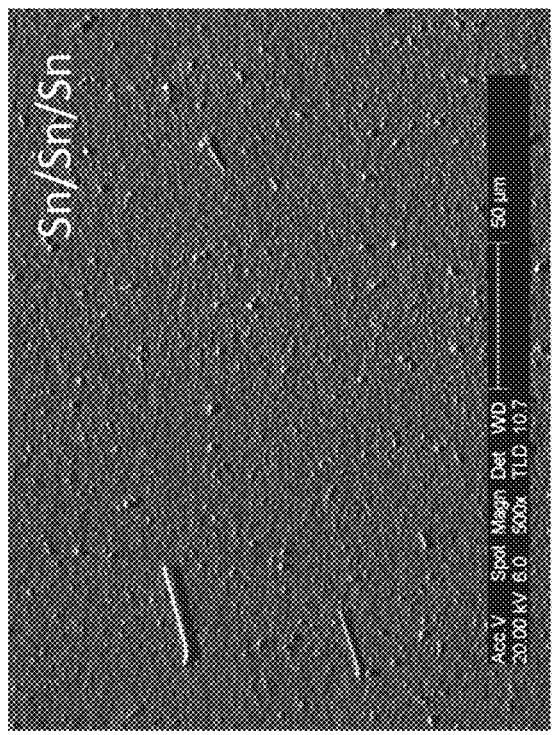

FIGS. 4A, 4B and 4C show scanning electron micrographs of the surfaces of the Sn/In/Sn test sample, as well as the monlithic Sn baseline sample and the Sn/Sn/Sn control sample, all being nominally 3 μm thick. All three samples have been aged for 4.5 months at ambient temperature. It is clear that the Sn/In/Sn sample shows no whiskers (i.e., growths of aspect ratio greater than 5) from the surface of the Sn (FIG. 3C). In contrast, both the baseline Sn sample and the control Sn/Sn/Sn sample show whiskers growing on the surface. Since whisker growth is seen in the tri-layered control sample, the internal interfaces are clearly not the reason for the prevention of whisker growth in the Sn/In/Sn samples. This clearly indicates that incorporation of In, and not the presence of internal interfaces, is the reason for whisker growth prevention.

Figure 5B:
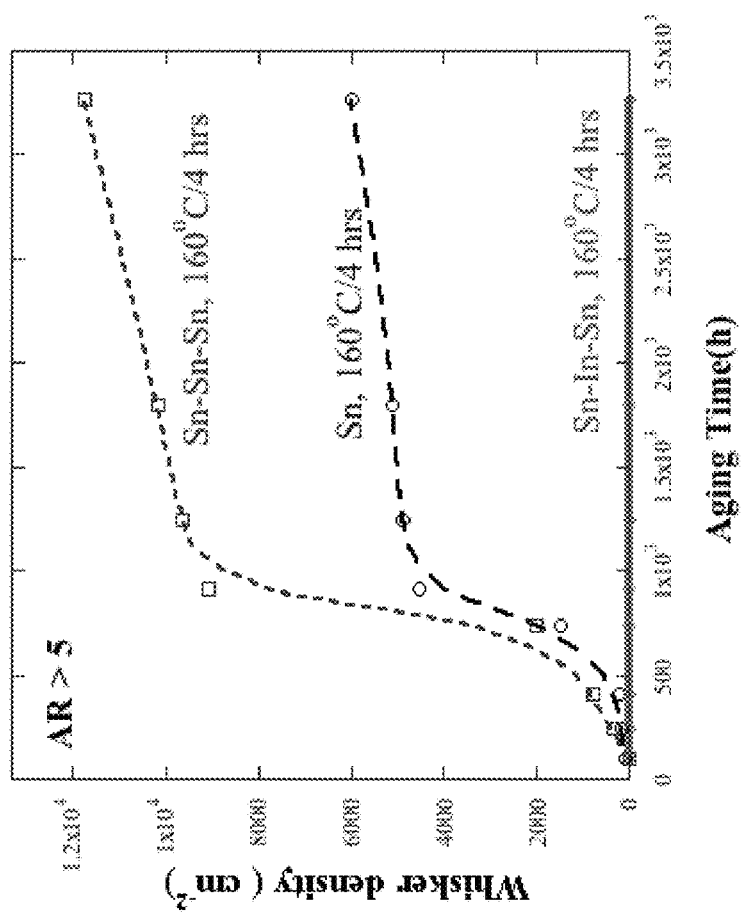
FIGS. 5A and 5B: Plots showing the density of whiskers (i.e., number of whiskers per unit area) of aspect ratio (AR) larger than 5 with aging time at room temperature, for total Sn film thicknesses of (FIG. 5A) 1 μm and (FIG. 5B) 3 μm. The 1 μm thick samples (FIG. 5A) were heat-treated at 160° C. for 45 minutes or 150° C. for 90 minutes, and the 3 μm thick samples (FIG. 5B) were heat-treated at 160° C. for 4 hours, to incorporate the In throughout the Sn coating. The monolithic Sn and Sn/Sn/Sn samples show a large whisker density for times up to 3000 hours, but the Sn/In/Sn samples show zero whisker growth at the same time.
Figure 5A:
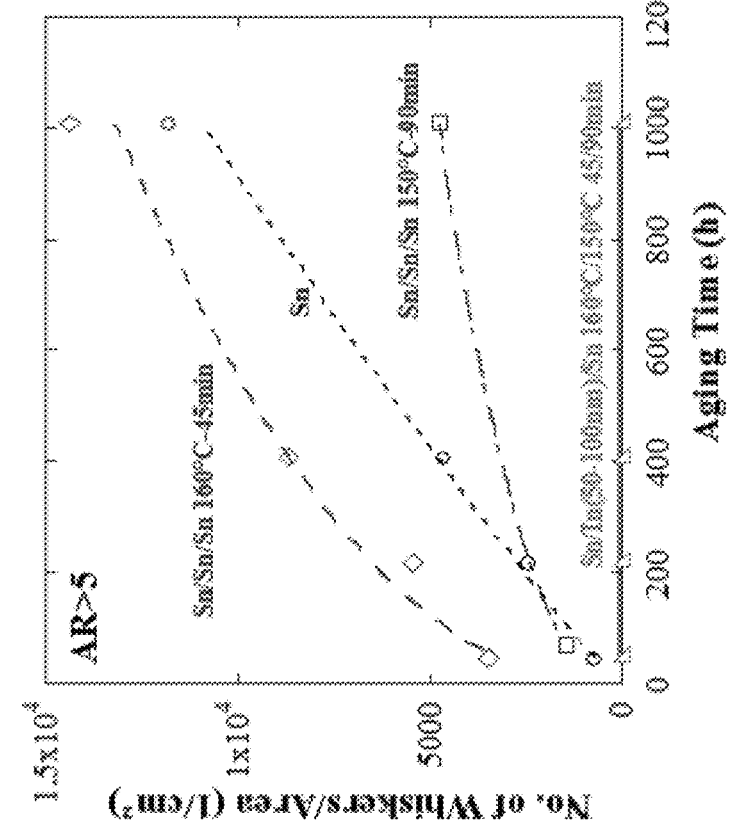

FIGS. 5A and 5B show whisker density data for the sandwich platings (both control and test), along with the baseline Sn-plated sample. Data are provided over a period of 6 weeks for the nominally 1 μm thick coatings, and up to 5 months for the nominally 3 μm thick coatings. It is observed that the presence of two additional interfaces within the control sandwich Sn/Sn/Sn structure significantly increases whisker growth relative to the monolithic Sn baseline sample (by a factor of 2) in both 1 μm and 3 μm-thick coatings, when the samples are subjected to identical HTs (160° C.). This indicates that the internal interfaces (or grain boundaries) are not effective in mitigating whisker growth in Sn.

In stark contrast to the Sn and Sn/Sn/Sn samples, it is noted that both the 150° C./90-min and the 160° C./45-min treatments completely stop the growth of long whiskers (i.e., aspect ratio >5) in the 1 μm-thick coating (FIG. 5A). It is further noted that the 160° C./4 hour-treatment completely stops the growth of long whiskers in the 3 μm-thick Sn/In/Sn coatings. The efficacy of both the 150° C. and 160° C. HTs in stopping whisker growth indicates that as long as there is full and relatively uniform incorporation of In in the Sn-plating, any HT should be effective in preventing whisker growth. Thus the observed prevention of whisker growth in the Sn/In/Sn samples is a direct effect of incorporating In into the Sn coating.

Figure 6:
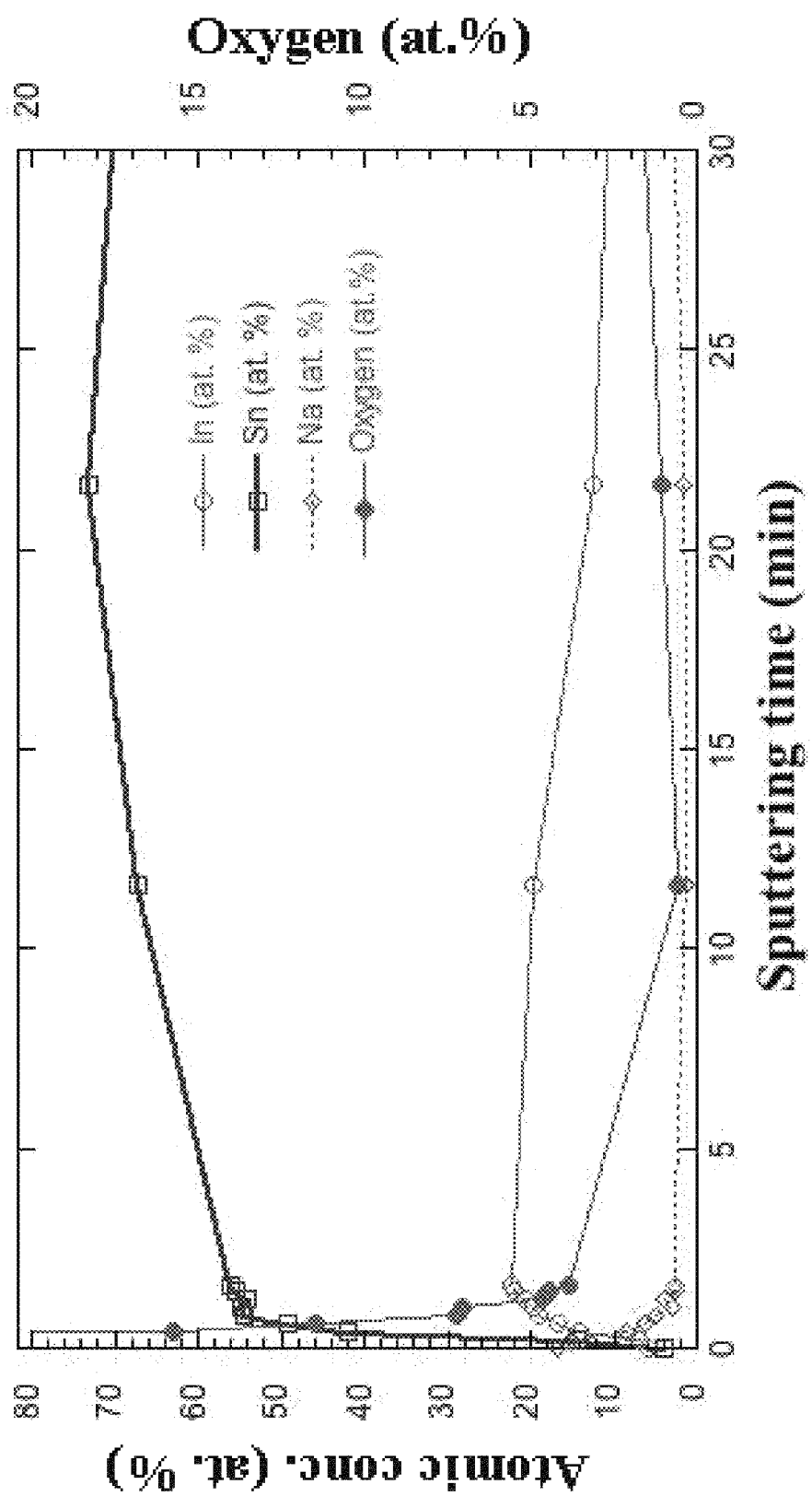
FIG. 6: Auger depth-profile showing the elemental composition of the 3 μm thick Sn/In/Sn coating in the through-thickness direction as a function of sputter time (which correlates with distance from the coating surface). Indium, which was originally at the middle of the coating thickness (corresponding to a sputtering time of about 18 minutes), is seen to be incorporated throughout the coating thickness.

FIG. 6 shows a composition depth-profile through the thickness of the 3 μm thick Sn/In/Sn coating, obtained by Auger electron spectroscopy. In the figure, a sputter time of zero corresponds to the surface of the 3 μm coating, and that of 18 minutes corresponds approximately to the middle of the 3 μm coating. It is observed that In is present throughout the entire thickness of the coating, although it was present only in the middle of the coating prior to HT. This indicates that during the HT at 160° C. for 4 hours, In has diffused all the way to the top of the coating, as well as to the bottom constituted by the copper-tin interface. It is further noted that the concentration of In is at least 7-8 atomic percent everywhere in the film, clearly showing that In is incorporated throughout the film. This complete incorporation of In throughout the Sn coating in the through-thickness direction is the key reason for the elimination of whiskers noted in the Sn/In/Sn samples.

The count of whiskers (aspect ratio greater than 5), as well as other growths (such as hillocks with aspect ratio between 2 and 5) in the three samples of 3 μm nominal thickness (Sn, Sn/Sn/Sn and Sn/In/Sn) after different extents of aging (38, 75 and 136 days) at ambient temperature is plotted in FIGS. 7A, 7B and 7C. In each plot, the whisker-count is over an identical area of the sample surface (0.005 cm$^2$). The aspect ratios of the growths are plotted in 3 ranges (long whiskers of AR>10, intermediate whiskers of 5<AR<10, and hillocks of 2<AR<5). It is clear that both the Sn and Sn/Sn/Sn sample surfaces show a significant number of long whiskers (AR>10), as well as intermediate whiskers (5<AR<10), whereas the Sn/In/Sn sample does not show either long or intermediate whiskers at any time. Furthermore, it is noted that shorter growths (such as hillocks of aspect ratio between 2 and 5) are abundant in both the Sn and Sn/Sn/Sn samples (~400 after 38 days and ~500 after 138 days), but are about 10 times lower in number in the Sn/In/Sn sample (~40 after 38 days and ~55 after 138 days). This dramatic, order-of-magnitude reduction hillock growth, and complete elimination of whisker growth due to indium incorporation through the entire Sn coating is highly significant. It is noted that alloying of the entire Sn coating with a relatively uniform amount of In is dramatically more effective in whisker mitigation than when In is either partially incorporated, or has a varying concentration along the thickness direction in the Sn layer. This is evident from a comparison of FIG. 3, where the In/Sn coating has a varying In concentration in the thickness direction, and FIG. 5, where the Sn/In/Sn coating has an approximately uniform concentration of In along its thickness.

A number of mechanisms may be responsible for whisker mitigation through elemental additions, including (i) reduction of compressive stresses in the Sn film that drives diffusion, which, for Sn coatings on Cu is due to the formation of interfacial intermetallics ($Cu_6Sn_5$), (2) a reduction of the tenacious nature of the surface oxide layer which limits surface vacancy sources and precludes stress-relief via diffusional processes and (3) a reduction in the grain boundary self-diffusion of Sn to transport matter from the plating-interior to the growing whisker. It is thought that each of these mechanisms operates in the Sn-coatings with In added.

First, the addition of In results in the formation of Cu—In intermetallic compounds at the interface between the Sn-plating and the Cu-substrate, resulting in the formation of Cu—In intermetallics (e.g., $Cu_{11}In_9$) or ternary Cu—In—Sn intermetallics, in addition to Cu—Sn intermetallics. This may reduce the ability of the interfacial intermetallics to reduce the compressive stress in the Sn coating that drives Sn diffusion, and hence whisker growth.

Secondly, In may get incorporated in the surface tin-oxide layer on the Sn-coating, and thereby reduce the stiffness or strength or tenaciousness of the surface passivation layer. This would reduce the reduce the stress gradient necessary to cause diffusion of Sn atoms to existing breaks in the surface oxide layer, and thereby reduce the driving force for Sn-whisker growth.

Thirdly, indium solute atoms can segregate at or near Sn grain boundaries in the coating and reduce the grain boundary diffusivity of Sn, thereby decreasing the flux of Sn to the coating-surface to drive whisker growth. In general, solute atoms, when present in non-equilibrium amounts, segregate at grain boundaries and precipitate out. Even when the solute concentration is below the solubility limit, some compositional segregation at grain boundaries is expected, particularly when the substitutional solute atoms are larger than the solvent atoms, since boundaries constitute regions of loose atomic packing, and segregation there reduces lattice strain due to solubility. Since the atomic radii of In atoms are larger than that for Sn (1.44 Å for In vs. 1.39 Å for Sn), In atoms is expected to segregate at the Sn grain boundaries. Recent molecular dynamics simulations have verified that In segregates near Sn grain boundaries, and thereby reduce Sn grain boundary diffusion substantially compared to unalloyed Sn. Significant slowing of grain boundary sliding, which is driven by boundary diffusion, in Cu bi-crystals has also been noted due to segregation of oversized substitutional solute atoms at the boundaries. It is clear that segregation of larger atoms can slow grain boundary diffusion, and this may be a key factor in the ability of In to slow diffusional flux to drive whisker growth.

In view of the many possible embodiments to which the principles of the disclosed processes and compositions may be applied, it should be recognized that the illustrated embodiments are only preferred examples of the invention and should not be taken as limiting the scope of the invention.

What is claimed is:

1. A method comprising:
incorporating indium into an entire electroplated Sn film for preventing growth of whiskers from the Sn film, wherein the Sn film is applied to a copper lead-frame, the indium is present in the entire Sn film in an amount of 3 to 20 wt %, based on a total weight of the film, the Sn film is Pb-free, and the Sn film has a thickness of 0.5 to 25 μm.

2. The method of claim 1, comprising providing a Sn layer having a bottom, middle and top and forming an indium layer at the bottom of, near the middle of, or near the top of the Sn layer resulting in a layered structure, and subsequently heat-treating the layered structure to incorporate the indium into an entire thickness of the Sn layer by diffusion.

3. The method of claim 1, wherein the Sn film into which the indium is incorporated is an alloy selected from Sn—Cu alloy, Sn—Ag alloy, or Sn, Cu and Ag alloy.

4. The method of claim 1, wherein whisker growth is substantially reduced from the Sn film by incorporating In into an entire thickness of the Sn film.

5. The method of claim 1, where growth of short protrusions on the Sn film is substantially reduced by incorporating In into an entire thickness of the Sn film.

6. The method of claim 1, where the In is introduced into the entire Sn film during initial deposition, forming an indium-containing Sn film layer in direct contact with the copper lead-frame.

7. The method of claim 1, where the In is introduced into the Sn film via a post-deposition process, and then diffusing the In into an entire thickness of the Sn film via a heat-treatment.

8. The method of claim 1, wherein the indium-containing Sn film is in direct contact with the copper lead-frame.

9. The method of claim 1, comprising forming a substantially pure indium layer in direct contact with the copper lead-frame, forming a Sn layer in contact with the pure indium layer resulting in a layered structure, and subsequently heat treating the layered structure to incorporate the indium into an entire thickness of the Sn film by diffusion.

10. The method of claim 1, comprising forming a Sn layer in direct contact with the copper lead-frame, forming a substantially pure indium layer in contact with the Sn layer resulting in a layered structure, and subsequently heat treating the layered structure to incorporate the indium into an entire thickness of the Sn film by diffusion.

11. The method of claim 1, comprising forming a first Sn layer in direct contact with the copper lead-frame, forming a substantially pure indium layer in contact with the first Sn layer, forming a second Sn layer on top of the substantially pure indium layer resulting in a layered structure, and subsequently heat treating the layered structure to incorporate the indium into an entire thickness of the Sn film by diffusion.

12. The method of claim 2, wherein the heat treatment may range from 125 to 200° C. for a sufficient time to incorporate the In into the entire thickness of the Sn film.

13. The method of claim 7, wherein the heat-treatment may range from 125 to 200° C. for a sufficient time to incorporate the In into the entire thickness of the Sn film.

14. The method of claim 11, wherein the heat treatment may range from 125 to 200° C. for a sufficient time to incorporate the In into an entire thickness of the Sn film.

15. A method comprising:
incorporating indium into an entire electroplated Sn film for preventing growth of whiskers from the Sn film, wherein the Sn film is applied to a copper substrate and the Sn film into which the indium is incorporated is an alloy containing greater than 90 wt % Sn and the indium is present in an amount of 5 to 10 wt %, based on the total weight of the indium-containing Sn film, and the Sn film has a thickness of 0.5 to 25 μm.

16. A method comprising:
incorporating indium into an entire electroplated Sn film for preventing growth of whiskers from the Sn film, wherein the Sn film is applied to a copper lead frame, the Sn film is Pb-free, and the Sn film has a thickness of 0.1 to 20 μm.

17. The method of claim 1, wherein the indium is present in the entire Sn film in an amount of 5 to 10 wt %, based on a total weight of the film.

18. The method of claim 3, wherein the indium is present in the entire Sn film in an amount of 5 to 10 wt %, based on a total weight of the film.

19. The lead-frame of claim 16, wherein the indium is present throughout the entire thickness of the Sn film in an amount of 5 to 10 wt %, based on a total weight of the indium-containing Sn film.

20. A method comprising:
incorporating indium into an entire Sn film for preventing growth of whiskers from the Sn film, wherein the Sn film is an electroplated film applied to a metallic substrate, the indium is present in the entire Sn film in an amount of 3 to 20 wt %, based on a total weight of the film, and the Sn film is Pb-free.

21. The method of claim 1, further comprising soldering onto the electroplated Sn film.

* * * * *